US009823784B2

(12) United States Patent
Sleeman et al.

(10) Patent No.: US 9,823,784 B2
(45) Date of Patent: Nov. 21, 2017

(54) CAPACITIVE TOUCH SCREEN WITH NOISE SUPPRESSION

(75) Inventors: Peter Sleeman, Hants (GB); Samuel Brunet, Hamble (GB); Matthew Trend, Hants (GB); Harald Philipp, Hamble (GB)

(73) Assignee: Atmel Corporation, San Jose, CA (US)

( * ) Notice: Subject to any disclaimer, the term of this patent is extended or adjusted under 35 U.S.C. 154(b) by 1196 days.

(21) Appl. No.: 12/421,705

(22) Filed: Apr. 10, 2009

(65) Prior Publication Data
US 2010/0044122 A1    Feb. 25, 2010

Related U.S. Application Data

(60) Provisional application No. 61/044,038, filed on Apr. 10, 2008.

(51) Int. Cl.
*G06F 3/044* (2006.01)
*G01D 5/24* (2006.01)
(Continued)

(52) U.S. Cl.
CPC .............. *G06F 3/044* (2013.01); *G01B 7/003* (2013.01); *G01D 5/2405* (2013.01); *G06F 1/16* (2013.01);
(Continued)

(58) Field of Classification Search
CPC ...................................................... G06F 3/044
(Continued)

(56) References Cited

U.S. PATENT DOCUMENTS

| | | |
|---|---|---|
| 5,730,165 A | 3/1998 | Philipp |
| 6,452,514 B1 | 9/2002 | Philipp |
| | (Continued) | |

FOREIGN PATENT DOCUMENTS

| | | | |
|---|---|---|---|
| CN | 101101525 | 1/2008 | ............ G06F 3/042 |
| EP | 1821175 A1 | 8/2007 | |
| | (Continued) | | |

OTHER PUBLICATIONS

"2009—Conductive Inkjet Technology", [online]. [retrieved Apr. 20, 2010]. Retrieved from the Internet: <URL: http://www.conductiveinkjet.com/about-us/latest-news/2009.aspx>, 1 pg.
(Continued)

*Primary Examiner* — Amare Mengistu
*Assistant Examiner* — Shawna Stepp Jones
(74) *Attorney, Agent, or Firm* — Baker Botts L.L.P.

(57) ABSTRACT

A capacitive touch sensor wherein the touch sensitive panel has drive electrodes arranged on the lower side of a substrate and sense electrodes arranged on the upper side. The drive electrodes are shaped and dimensioned to substantially entirely cover the touch sensitive area with individual drive electrodes being separated from each other by small gaps, the gaps being so small as to be practically invisible. The near blanket coverage by the drive electrodes also serves to screen out interference from noise sources below the drive electrode layer, such as drive signals for an underlying display, thereby suppressing noise pick-up by the sense electrodes that are positioned above the drive electrodes.

3 Claims, 10 Drawing Sheets

(51) Int. Cl.
*H03K 17/96* (2006.01)
*G01B 7/00* (2006.01)
*G06F 3/041* (2006.01)
*G06F 1/16* (2006.01)
*H05K 1/02* (2006.01)

(52) U.S. Cl.
CPC .......... *G06F 3/0412* (2013.01); *G06F 3/0416* (2013.01); *H03K 17/9622* (2013.01); *H05K 1/0296* (2013.01); *G01B 2210/58* (2013.01); *G06F 2203/04111* (2013.01); *G06F 2203/04112* (2013.01)

(58) Field of Classification Search
USPC ............................................ 178/18; 345/173
See application file for complete search history.

(56) References Cited

U.S. PATENT DOCUMENTS

| | | | |
|---|---|---|---|
| 7,148,704 | B2 | 12/2006 | Philipp |
| 7,511,702 | B2* | 3/2009 | Hotelling ................ 345/173 |
| 7,663,607 | B2 | 2/2010 | Hotelling |
| 7,864,503 | B2 | 1/2011 | Chang |
| 7,875,814 | B2 | 1/2011 | Chen |
| 7,920,129 | B2 | 4/2011 | Hotelling |
| 8,031,094 | B2 | 10/2011 | Hotelling |
| 8,031,174 | B2 | 10/2011 | Hamblin |
| 8,040,326 | B2 | 10/2011 | Hotelling |
| 8,049,732 | B2 | 11/2011 | Hotelling |
| 8,179,381 | B2 | 5/2012 | Frey |
| 8,217,902 | B2 | 7/2012 | Chang |
| 2007/0062739 | A1 | 3/2007 | Philipp |
| 2007/0257894 | A1* | 11/2007 | Philipp .................... 345/173 |
| 2008/0062139 | A1* | 3/2008 | Hotelling et al. ........... 345/173 |
| 2008/0309635 | A1 | 12/2008 | Matsuo |
| 2009/0315854 | A1 | 12/2009 | Matsuo |
| 2012/0242588 | A1 | 9/2012 | Myers |
| 2012/0242592 | A1 | 9/2012 | Rothkopf |
| 2012/0243151 | A1 | 9/2012 | Lynch |
| 2012/0243719 | A1 | 9/2012 | Franklin |
| 2013/0076612 | A1 | 3/2013 | Myers |

FOREIGN PATENT DOCUMENTS

| | | | | |
|---|---|---|---|---|
| EP | 1 840 714 | A1 | 10/2007 | ............ G06F 3/041 |
| WO | 2009007704 | A1 | 1/2009 | |
| WO | 2009016382 | A2 | 2/2009 | |
| WO | 2009027629 | A1 | 3/2009 | |
| WO | WO 2012/129247 | | 9/2012 | |

OTHER PUBLICATIONS

"Cambrios Technologies Corporation Awarded Department of Defense Contract for Flexible Solar Cells", [online]. [retrieved Apr. 20, 2010]. Retrieved from the Internet: <URL: <http://www.cambrios.com/200/DOD_Release.htm>, (Apr. 12, 2010), 2 pgs.

"New Silver Conductive Inks Target High-Growth Touch Screen and OLED Markets", [online]. [retrieved Apr. 20, 2010]. Retrieved from the Interent: <URL: http://www2.dupont.com/MCM/en_US/news_events/article20100413.htrnl>, (Apr. 13, 2010), 3 pgs.

"Printing of Antennas and Flexible Circuits", Core Applications & Technologies, © 2009 Conductive Inkjet Technology Ltd., (Oct. 2009), 23 pgs.

Hörteis, M., et al., "Fine Line Printed and Plated Contacts on High OHMIC Emitters Enabling 20% Cell Efficiency", 2009 34th IEEE Photovoltaic Specialists Conference (PVSC), (2009), 000060-00065.

Atmel Corporation, "Touch Sensors Design Guide" ; Jan. 22, 2009; http://www.atmel.com/dyn/resources/prod_documents/doc10620.pdf.

*Chinese First Office Action and English Translation of the Text of the First Office Action* for Application No. 200910134421.2; 15 pages, dated Jul. 17, 2012.

Questel English Translation of Chinese Patent No. CN 101101525; 9 pages, dated Aug. 21, 2012.

U.S. Appl. No. 61/454,936, filed Mar. 21, 2011, Myers.
U.S. Appl. No. 61/454,950, filed Mar. 21, 2011, Lynch.
U.S. Appl. No. 61/454,894, filed Mar. 21, 2011, Rothkopf.

The Patent Office of the People's Republic of China; Second Office Action and English Translation of Text of the Second Office Action for Chinese Patent Application No. 200910134421.2; 15 pages, dated May 9, 2013.

Chinese Fifth Office Action and English Translation of the Text of the *Fifth Office Action Issued by State Intellectual Property Office* for Application No. 200910134421.2, 14 pages, dated Dec. 22, 2014.

Taiwan Office Action and English Translation of the Text of the *Office Action Issued by Intellectual Property Office* for Application No. 098112108, 12 pages, dated Apr. 9, 2015.

* cited by examiner

CAPACITIVE TOUCH SCREEN WITH NOISE SUPPRESSION

BACKGROUND OF THE INVENTION

The following describes a new invention in the field of capacitive touch screens or 2-dimensional capacitive transducing (2DCT) sensors. U.S. Pat. No. 6,452,514, U.S. Pat. No. 7,148,704 and U.S. Pat. No. 5,730,165 disclose a capacitive measurement technique which makes it possible to create touch responsive transparent or opaque sensing regions that can detect human touch through several millimeters of plastic or glass. Described herein is a new structure for a touch screen that allows significant enhancement in both operation and appearance of the sensor.

U.S. Pat. No. 6,452,514 describes a capacitive measurement technique which is incorporated by reference herein, that uses a transmit-receive process to induce charge across the gap between an emitting electrode and a collecting electrode (the transmitter and the receiver respectively, also referred to as X and Y). The capacitive sensing described in U.S. Pat. No. 6,452,514 may be referred to as mutual capacitive or active type 2DCT sensors. As a finger touch interacts with the resulting electric field between the transmitter and receiver electrodes, the amount of charge coupled from transmitter to receiver is changed. A particular feature of the measurement technique is that most of the electric charge tends to concentrate near to sharp corners and edges (a well known effect in electrostatics). The fringing fields between transmitter and receiver electrodes dominate the charge coupling. The electrode design therefore tends to focus on the edges and the gaps between neighboring transmitter and receiver electrodes in order to maximize coupling and also to maximize the ability of a touch to interrupt the electric field between the two, hence giving the biggest relative change in measured charge. Large changes are desirable as they equate to higher resolution and equally to better signal to noise ratio.

A specially designed control chip can detect these changes in charge. It is convenient to think of these changes in charge as changes in measured coupling capacitance between transmitter and receiver electrodes (charge is rather harder to visualize). The chip processes the relative amounts of capacitive change from various places around the touch screen and uses this to compute the absolute location of touch as a set of x and y coordinates. In order for this to be possible a set of spatially distributed electrodes must be used. Commonly, these electrodes are required to be transparent so that the touch screen can operate in front of a display such as a liquid crystal display (LCD) screen or other display screen type, for example organic light emitting diode (OLED) type screens. To achieve this electrodes are often fabricated from a material known as Indium Tin Oxide (ITO) but other transparent conductive materials are also suitable. ITO has desirable properties in optical terms, but can be substantially ohmic which can have a negative impact on capacitive measurements if the resistance and capacitance combination leads to time constants that prevent timely settling of the charge transfer process.

Another example 2DCT is disclosed in US20070062739A1.

In order to create a sensor that can report the absolute coordinates of the location of the touch (or more than one touch) on the surface of the sensor or the overlying plastic or glass panel, the electrode arrangement must be specifically designed to optimize the following aspects:

accuracy of the reported touch location i.e. correspondence between real physical location and reported location. This is broadly known as "linearity" or "non-linearity" when referring to the measured error.

immunity of the sensor to external electrical noise sources.

sensitivity of the sensor to human touch i.e. its ability to detect a touch through thicker panel materials, or to detect a lighter or smaller touch.

spatial resolution of the sensor i.e. its ability to report small changes in touch location.

quality of the output in terms of the noise or jitter amplitude in the reported location.

optical quality of the sensor for the transmission of light, for factors like its transparency, its hue, its haze, the overall electrode pattern visibility etc.

optical behavior of the sensor to shallow angle reflected light i.e. the visibility of the electrode pattern and any color shifts in the reflected light.

minimizing any errors induced in the reported location caused by slight mechanical flexing during human touch. This tends to cause a change in the distance between the sensor and any underlying display or other mechanical grounded structure which in turn causes capacitive changes similar to a touch.

reducing the electrical resistance of the electrodes to allow efficient capacitive sensing within an acceptable time (often the overall measurement time of the touch screen needs to be at or below 10 ms so limiting the amount of settling time that can be used to make each measurement).

reducing the number of layers in the physical construction to minimize manufacturing cost and to improve optical properties.

reducing side-effects in the quality of reported coordinates or in the ability of the sensor to detect a touch, near to the edges of the sensor. This region typically presents difficult challenges in this regard because of the non-uniformity of the electrode pattern (its ends) and the fact that interconnecting tracks tend to reside at the edges of the sensor.

reducing the total number of electrodes used as each electrode requires some connection to the control chip and so more electrodes equates to a more complex chip and hence higher cost.

In order to optimize linearity, the electrode pattern design is critical. Linearity is one of the primary measures of quality of a touch screen because as the linearity degrades, it becomes harder to report an accurate touch location in some regions of the screen. A sensor design that offers excellent intrinsic linearity is a key goal therefore. While it is possible to mathematically correct such non-linearity via well known techniques such as a look-up table or piecewise-linear correction, any of these methods actually trades off spatial resolution for reported linearity, and so is always a compromise.

In designing the electrodes a key objective is to arrange that the electric field that propagates from transmitter to receiver does so in a way that causes a smooth and progressive gradation from one electrode to the next. This way, as a touch moves from region to region, the capacitive change measured by the control chip also changes in a smooth and progressive way and hence contributes to good intrinsic linearity. The touch itself actually influences this process significantly and will tend to "mix" the fields from neighboring electrodes. This contributes to the overall smoothness of transition, but does tend to lead to some variation in linearity depending on the size of the touch applied. Again, electrode design needs to be carefully considered to optimize the linearity across a range of touch sizes.

As described above the quality of the output in terms of the noise or jitter amplitude in the reported location should be optimized. However, 2DCT sensors can be sensitive to external ground loading. Furthermore, electrical noise generated from LCD screens can interfere with capacitance measurements when a pointing object approaches the screen. Known methods to minimize the effects of noise on capacitive coupling is to increase the separation or air gap between an LCD screen and an overlaying 2DCT sensor. Alternatively a shielding layer may be incorporated between the LCD screen and a 2DCT sensor to reduce or block the noise induced by the LCD screen.

WO 2009/027629 published on 5 Mar. 2009 describes a capacitive touch sensor comprising a dielectric panel overlying a drive electrode with two sense electrodes. One of the sense electrodes is positioned to be shielded from the drive electrode by the first sense electrode, so that the first sense electrode receives the majority of the charge coupled from the drive electrode and the second sense electrode primarily registers noise. A sensing circuit including two detector channels is connected to the first (coupled) and second (noise) sense electrodes to receive signal samples respectively. The sensing circuit is operable to output a final signal obtained by subtracting the second signal sample from the first signal sample to cancel noise.

However, the methods described above increase the size and thickness, and may decrease the resolution of a device incorporating a display screen with a 2DCT sensor when it is more fashionable and desirable to produce smaller devices. Furthermore, additional steps are required during manufacture and as a result there is an increased cost due to further components being needed.

European patent EP 1821175 describes an alternative solution to reduce the noise collected on a 2DCT touch sensor. EP 1821175 discloses a display device with a touch sensor which is arranged so that the two dimensional touch sensor is overlaid upon a display device to form a touch sensitive display screen. The display device uses an LCD arrangement with vertical and horizontal switching of the LCD pixels. The touch sensing circuit includes a current detection circuit, a noise elimination circuit as well as a sampling circuit for each of a plurality of sensors, which are arranged to form the two-dimensional sensor array. The current detection circuit receives a strobe signal, which is generated from the horizontal and vertical switching signals of the LCD screen. The strobe signal is used to trigger a blanking of the current detection circuit during a period in which the horizontal switching voltage signal may affect the measurements performed by the detection circuit.

WO 2009/016382 published on 5 Feb. 2009 describes a sensor used to form a two dimensional touch sensor, which can be overlaid on a liquid crystal display (LCD) screen. As such, the effects of switching noise on the detection of an object caused by a common voltage signal of the LCD screen can be reduced. The sensor comprises a capacitance measurement circuit operable to measure the capacitance of the sensing element and a controller circuit to control charging cycles of the capacitance measurement circuit. The controller circuit is configured to produce charging cycles at a predetermined time and in a synchronous manner with a noise signal. For example, the charge-transfer cycles or 'bursts' may be performed during certain stages of the noise output signal from the display screen, i.e. at stages where noise does not significantly affect the capacitance measurements performed. Thus, the sensor can be arranged to effectively pick up the noise output from a display screen and automatically synchronize the charge-transfer bursts to occur during stages of the noise output cycle.

However, noise reduction techniques such as those described above require more complex measurement circuitry. This makes the measurement circuitry more expensive and may increase the time taken to complete an acquisition cycle.

It would therefore be desirable to provide an electrode pattern suitable for mutual capacitive or active type 2DCT sensor that can be embodied with an electrode pattern with reduced noise pick-up.

SUMMARY OF THE INVENTION

According to a first aspect of the invention, a capacitive touch sensor is provided comprising a touch sensitive panel having a plurality of drive electrodes arranged on one side of a substrate in a first layer and a plurality of sense electrodes arranged on the other side of the substrate in a second layer so that the sense electrodes cross the drive electrodes at a plurality of intersections offset from each other by the thickness of the substrate, wherein the drive electrodes substantially entirely cover the first layer with individual ones of the drive electrodes being separated from neighboring drive electrodes by small gaps.

This approach has several important advantages. The touch sensor only requires the two layers of electrodes recited above to function, so that a third noise-suppressing layer as adopted in some prior art designs is superfluous. A two layer construction also leads to improved optical transmission, thinner overall depth and lower cost compared with designs with a greater numbers of layers. The area-filling design for the drive electrodes with small gaps allows for an almost invisible drive electrode pattern, for example when using ITO, and also isolates the sense lines from capacitive effects below the first layer, for example noise from an underlying LCD module or other noise source. The "flooding" of the first layer with conductive material also allows the second layer to be implemented with narrow sense electrodes, far narrower than the dimension of the sensing object. The second layer can also be made invisible either through in-filling of islands of electrode material between the sense electrodes to also "flood" the second layer, or alternatively simply by making the sense electrodes very thin or very sparse with line widths so small that they are invisible. This sparse approach using meshes is described further below. The reduced sense electrode area also reduces susceptibility to coupling noise from touches.

The drive electrodes are preferably separated by a pitch of comparable dimension to the touch size of the touching object for which the sensor is designed.

The touching object for which the sensor is designed may be a finger, e.g. of touch size 8-10 mm diameter, and the pitch is around 8 mm or less. A stylus could also be used.

The small gaps between adjacent drive electrodes are preferably dimensioned to be sufficiently small to be invisible or almost invisible, for example less than around 100 micrometers, preferably having dimensions of a few tens of micrometers.

The sense electrodes are advantageously narrow in comparison to the size of the touching object. For example, the sense electrodes may have a line width of one quarter or less of the size of the touching object. In one embodiment, the touching object for which the sensor is designed is a finger with a touch size of 8-10 mm diameter, and the sense electrodes have a line width of 2 mm or less, for example 0.5 mm. The sense electrodes may have a line width one quarter or less than the pitch of the drive electrodes.

In some embodiments, the second layer additionally accommodates isolated elements arranged between the sensing electrodes so that the sense electrodes and the isolated elements together substantially entirely cover the second layer with individual ones of the sense electrodes and isolated elements being separated from each other by small gaps. The small gaps have comparable function and dimensions to the small gaps between the drive electrodes.

As mentioned above, the first and second layers of electrodes may be the only electrode layers provided, a two-layer electrode construction leading to improved optical transmission for transparent embodiments such as used for touch-sensitive displays, thinner overall construction, and lower cost.

The drive electrodes preferably cover the first layer sufficiently entirely that the sense electrodes in the second layer are substantially isolated from capacitive effects below the first layer.

An important combination is the above-defined capacitive touch sensor with a display module. The display module, for example an LCD or OLED display panel, will typically by arranged below the first layer and distal the touch surface so that from top to bottom, or outside to inside the device, the components will be—dielectric layer the upper surface of which will be the touch surface—layer 2—substrate—layer 1—display panel, with the display panel being inside the device housing or outer shell. In a display application, the electrodes will likely be made of ITO.

In some embodiments, each drive and/or sense electrode is made of a continuous sheet of electrically conductive material, such as ITO or a metal. In other embodiments, each drive and/or sense electrode is made of a mesh or filigree pattern of interconnected lines of highly conductive material which collectively define each electrode. Still further embodiments use continuous sheets for one of the electrode types and meshes for the other electrode type. In the mesh approach, the interconnected lines preferably have a sufficiently small width so as to be invisible or almost invisible. They can then be made of material that is not inherently invisible, e.g. a metal such as copper, but still remain practically invisible.

The invention can be implemented to form a Cartesian xy grid of touch sensor locations. In particular, the drive electrodes can extend in a first linear direction and the sense electrodes in a second linear direction transverse to the first linear direction so that the plurality of intersections form a grid pattern, for example a square, diamond or rectangular grid. The invention can also be implemented to form a polar 'rθ' grid, wherein the drive electrodes extend arcuately and the sense electrodes extend radially so that the plurality of intersections lie on one or more arcuate paths.

A further aspect of the invention relates to a touch sensitive panel for a capacitive touch sensor, the touch sensitive panel having a plurality of drive electrodes arranged in a first layer and a plurality of sense electrodes arranged in a second layer so that the sense electrodes cross the drive electrodes at a plurality of intersections offset from each other, wherein the drive electrodes substantially entirely cover the first layer with individual ones of the drive electrodes being separated from neighboring drive electrodes by small gaps. The first and second layers can be disposed on opposite sides of a common substrate offset from each other by the thickness of the substrate. Alternatively, the first and second layers can be disposed on different substrates which can then be assembled in engagement with each other to provide an offset between the two layers equal to the thickness of one of the substrates, or both of them, depending on which side of the substrates the electrodes are arranged.

The touch sensitive panel has a plurality of drive electrodes arranged on one side of a substrate in a first layer and a plurality of sense electrodes arranged on the other side of the substrate in a second layer so that the sense electrodes cross the drive electrodes at a plurality of intersections offset from each other by the thickness of the substrate, wherein the drive electrodes substantially entirely cover the first layer with individual ones of the drive electrodes being separated from neighboring drive electrodes by small gaps.

A still further aspect of the invention relates to a method of manufacturing a touch sensitive panel for a capacitive touch sensor comprising:

providing a substrate having first and second sides;

depositing on the first side of the substrate a first layer of conductive material in a first pattern forming a plurality of drive electrodes, wherein the drive electrodes substantially entirely cover the first layer with individual ones of the drive electrodes being separated from neighboring drive electrodes by small gaps; and depositing on the second side of the substrate a second layer of conductive material in a second pattern forming a plurality of sense electrodes so that the sense electrodes cross the drive electrodes at a plurality of intersections offset from each other by the thickness of the substrate.

The invention may also be defined by a touch sensitive panel having an electrode pattern comprising a plurality of drive electrodes extending in a first direction and spaced apart in a second direction; wherein the drive electrodes are spaced apart by a distance of less than 100 μm and have a pitch of less than or equal to 8 mm.

The drive electrodes may be spaced apart by a distance 90, 80, 70, 60, 50, 40, 30, 20 or 10 μm. The pitch of the drive electrodes may be less than or equal to 5 mm.

The same extent of each drive electrode may be coupled to adjacent drive electrodes using a resistor. The typical resistor values used range from a few KΩ to 10's of KΩ. The resistors may be discrete resistors, screen printed resistive elements or meandering patterns formed using the same material as the drive electrodes.

The width of the drive electrodes at the outer edges of the electrode pattern may be half the width of the other drive electrodes.

The electrode pattern may further comprise a plurality of sense electrodes extending in a second direction and spaced apart in the first direction crossing the drive electrodes.

The sense electrodes may be spaced apart by a plurality of isolated electrodes wherein having the same extent in the first and second direction as the width of the sense electrodes. The space or gaps between the isolated electrodes is of the order of 10's of μm.

The width of the sense electrodes may be substantially less than the width of the drive electrodes. The width of the sense electrode is typically in the range of 100 to 1000 μm.

According to another aspect of the present invention there is provided a two-dimensional position sensor comprising the electrode pattern of drive electrodes and sense electrodes, wherein the drive electrodes and the sense electrodes may be disposed on opposing surfaces of a substrate.

According to another aspect of the present invention there is provided a two-dimensional position sensor comprising the electrode pattern of drive electrodes and sense electrodes, wherein the drive electrodes and the sense electrodes may be disposed on a surface of two different substrates.

The two-dimensional position sensor may further comprise a controller comprising a drive unit for applying drive signals to the drive electrodes, and a sense unit for measuring sense signals received from each of the respective sense electrode representing a degree of capacitive coupling of the drive signals between the drive electrodes and each of the sense electrodes.

The controller may further comprise a processing unit for calculating a position of an interaction with the sensitive area from an analysis of the sense signals obtained by applying drive signals to the drive electrodes.

The processing unit may be operable to determine position in the first direction by an interpolation between sense signals obtained from each of the plurality of sense electrodes.

The processing unit may be operable to determine position in the second direction by an interpolation between sense signals obtained by sequentially driving each of the plurality of drive electrodes with respective drive signals.

According to another aspect of the present invention there is provided a two-dimensional position sensor comprising the electrode pattern of drive electrodes, further comprising a plurality of sense electrodes extending in a second direction and spaced apart in the first direction crossing the drive electrodes; wherein the drive electrodes and the sense electrodes are disposed on opposing surfaces of a substrate; the two-dimensional sensor further comprising a controller comprising: a drive unit for applying drive signals to the drive electrodes; wherein the drive electrodes are grouped together into a subset of drive electrodes such that the drive unit is operable to apply drive signals to the outer-most drive electrodes of each subset of drive electrodes; and a sense unit for measuring sense signals received from each of the respective sense electrode representing a degree of capacitive coupling of the drive signals between the drive electrodes and each of the sense electrodes.

According to another aspect of the present invention there is provided a method of sensing position of an actuation on a two-dimensional position sensor comprising: an electrode pattern comprising a plurality of drive electrodes extending in a first direction and spaced apart in a second direction; wherein the drive electrodes are spaced apart by a distance of less than 100 μm and have a pitch of less than or equal to 8 mm; a plurality of sense electrodes extending in a second direction and spaced apart in the first direction crossing the drive electrodes; wherein the drive electrodes and the sense electrodes are disposed on opposing surfaces of a substrate; the method comprising: applying drive signals to the drive electrodes, measuring sense signals received from each of the respective sense electrodes representing a degree of capacitive coupling of the drive signals between the drive electrodes and each of the sense electrodes; determining position in the first direction by an interpolation between sense signals obtained from each of the plurality of sense electrodes; and determining position in the second direction by an interpolation between sense signals obtained by sequentially driving each of the plurality of drive electrodes with respective drive signals.

The invention may alternatively be defined by a two-dimensional touch screen comprising: a substrate; a plurality of driven-electrodes extending in a first direction on a first surface of the substrate; a plurality of Y-electrodes extending in a second direction being perpendicular to the first direction on a second surface of the substrate opposing the first surface of the substrate; wherein the plurality of driven-electrodes substantially fill an area of the first surface of the substrate, for example.

Two-dimensional touch screens are typically used as on overlay on a display screen. The area filling design of the driven electrodes leads to an almost invisible electrode pattern. The area filling design also provides partial attenuation of noise coupled from an underlying LCD module or other noise source.

The two-dimensional touch screen may further comprise a subset of driven-electrodes comprising two outer most driven-electrodes and two or more intermediate driven-electrodes connected together using a plurality of resistive elements. This reduces the interconnecting wiring between the touch screen and the control chip.

The width of the two outer most driven electrodes may be half the width of the other driven-electrodes to improve the overall linearity of the measured capacitance.

The width of the Y-electrodes may be substantially less than the width of the driven-electrodes such that the Y-electrodes are not easily visible to the human eye and narrower electrodes provide better noise immunity.

The spacing between each of the plurality of driven-electrodes may be less then 100 μm to make the pattern substantially invisible to the human eye.

The pitch of the drive-electrodes and the Y-electrodes may be 8 mm or less to achieve a good intrinsic linearity and to match the size of a typical finger touch.

The area between each of said Y-electrodes may be filled with isolated conductive material such that is it possible to make narrow Y-electrodes while still have a pattern that is substantially invisible to the human eye and can reduce the susceptibility to coupling noise from a touch.

The Y-electrodes of the two-dimensional touch screen may further comprise a plurality of equally disposed cross-members running in the first direction. This can achieve uniform field patterns that are symmetrical in all regions of the touch screen leading to good linearity. These cross members effectively act to spread the electric field further beyond the primary Y-electrode to overlap the region which can gradate the electric field.

According to the another aspect of the invention there is provided a method of determining a touch location adjacent a two-dimensional touch screen comprising: a substrate; a plurality of driven-electrodes extending in a first direction on a first surface of the substrate; a plurality of Y-electrodes extending in a second direction being perpendicular to the first direction on a second surface of the substrate opposing the first surface of the substrate; wherein the plurality of driven-electrodes substantially fill an area of the first surface of the substrate; the method comprising the steps of: applying a potential to each of the plurality of driven-electrodes while the other driven-electrodes are held at a zero potential; measuring the capacitance at each intersection formed between the driven electrodes and the Y electrodes; generating measurements at each intersection formed between the driven electrodes and the Y electrodes; and computing the touch location based on the generated measurements.

BRIEF DESCRIPTION OF THE DRAWINGS

For a better understanding of the invention, and to show how the same may be carried into effect, reference is now made by way of example to the accompanying drawings, in which.

DETAILED DESCRIPTION

Described herein is a two-electrode layer construction for a capacitive touch screen or 2DCT sensor.

Figure 1A:
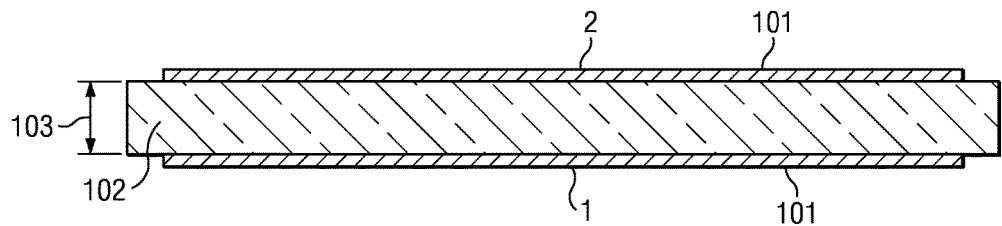
FIG. 1A shows a side view of a two-electrode layer capacitive touch screen according to an embodiment of the present invention.
Figure 1B:
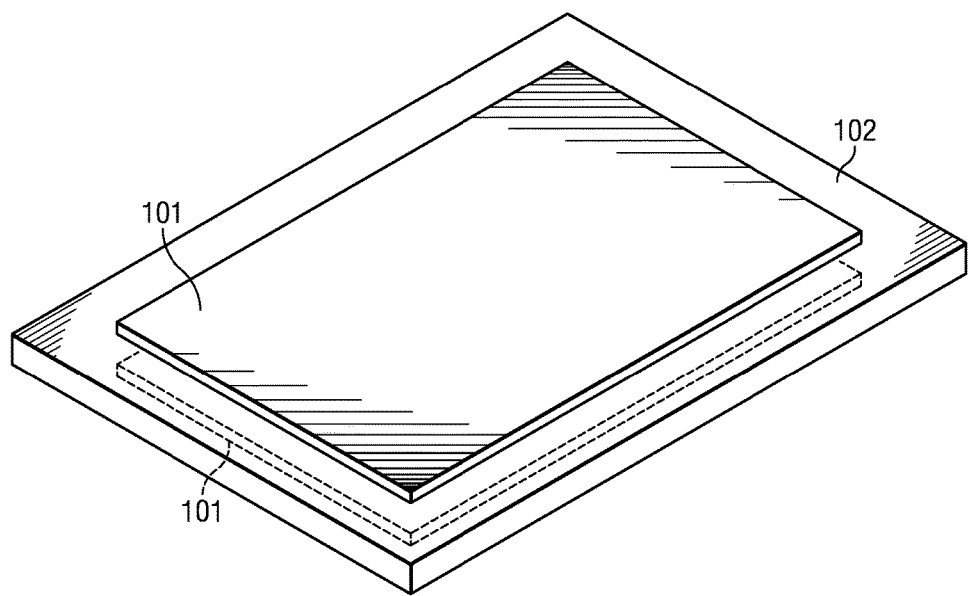
FIG. 1B shows a perspective view of a two-electrode layer capacitive touch screen according to an embodiment of the present invention.

FIGS. 1A and 1B are schematic drawings in side view and perspective view of a two-electrode layer construction for a capacitive touch screen or 2DCT sensor. The layers 101 can generally be made of any conductive material and the layers can be arranged to oppose each other on two sides of any isolating substrate 102 such as glass, PET, FR4 etc. The thickness of the substrate 103 is non critical. Thinner substrates lead to higher capacitive coupling between the layers which must be mitigated in the control chip. Thicker substrates decrease the layer to layer coupling and are generally more favorable for this reason (because the measured change in capacitance is a larger fraction of the layer-to-layer capacitance so improving signal-to-noise ratio). Typical substrate thickness' range from 10's to 100's of μm. Furthermore it will appreciated that a dielectric or isolating layer may be disposed overlying the two-electrode layer construction on Layer 2 to prevent an object adjacent the 2DCT sensor making contact with the surface of the layers. This isolating layer might be a glass or plastics layer.

Figure 1C:
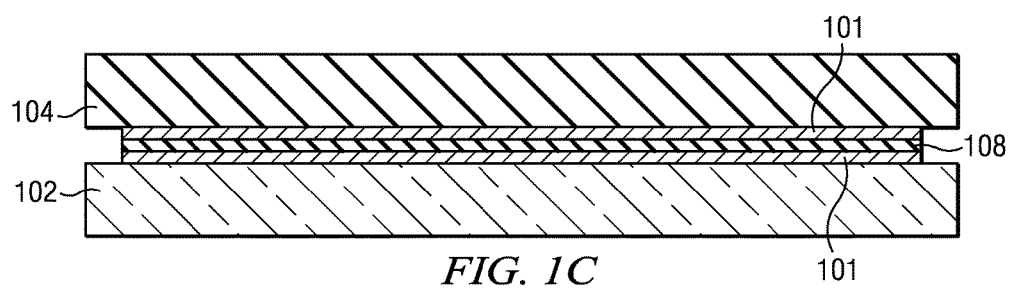
FIG. 1C shows a side view of a two-electrode layer capacitive touch screen according to another embodiment of the present invention.

FIG. 1C shows the side view of an alternative arrangement to the two-electrode layer construction for the capacitive touch screen or 2DCT sensor shown in FIG. 1A according another embodiment of the present invention. In FIG. 1C the layers 101 are disposed on the same surface of the isolating substrate 102, separated by an isolation layer 108. An additional dielectric or isolating layer 104 is disposed on the electrodes layers to prevent an object adjacent the 2DCT sensor making contact with the layers surface.

Figure 1D:
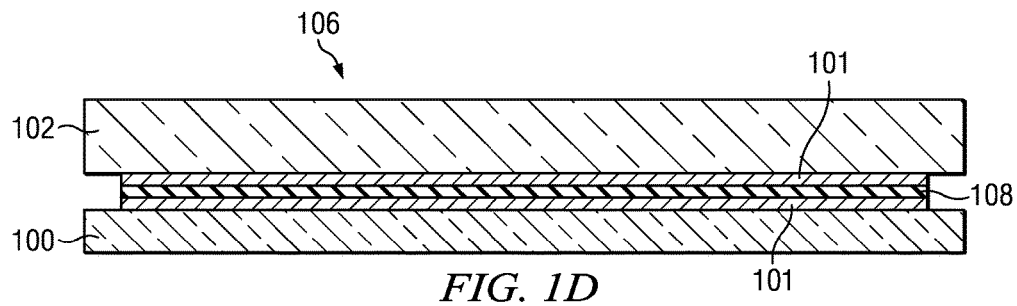
FIG. 1D shows a side view of a two-electrode layer capacitive touch screen according to another embodiment of the present invention.

FIG. 1D shows the side view of an alternative arrangement to the two-electrode layer construction for the capacitive touch screen or 2DCT sensor shown in FIG. 1A according another embodiment of the present invention. In FIG. 1D the layers 101 are disposed on the same surface of the isolating substrate 102, separated by an isolation layer 108. However, the electrode layers 101 are disposed on the surface of the isolating substrate that is farthest from the touch surface 106. A display panel 100 is also shown (with hatching) arranged below the substrate 102 that bears the electrode layers 101. It will be understood that the display panel in combination with the touch sensor make a touch screen. A display panel could also be fitted to an arrangement as shown in FIG. 1C above.

Figure 1E:
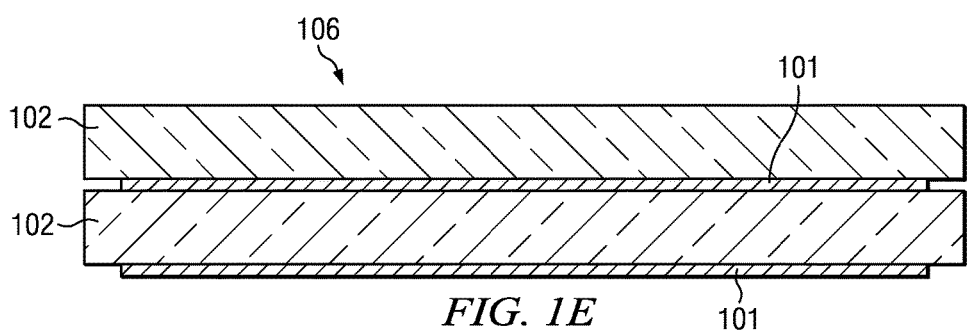
FIG. 1E shows a side view of a two-electrode layer capacitive touch screen according to an embodiment of the present invention.

FIG. 1E shows the side view of an alternative arrangement to the two-electrode layer construction for the capacitive touch screen or 2DCT sensor shown in FIG. 1A according another embodiment of the present invention. In FIG. 1E each of the layers 101 are disposed on a surface of two different isolating substrates 102. The two isolating substrates are brought together such that the two electrode layers 101 are separated from the touch surface 106 and are separated by one of the isolating substrates. A display panel could also be fitted to an arrangement as shown in FIG. 1E.

Figure 2A:
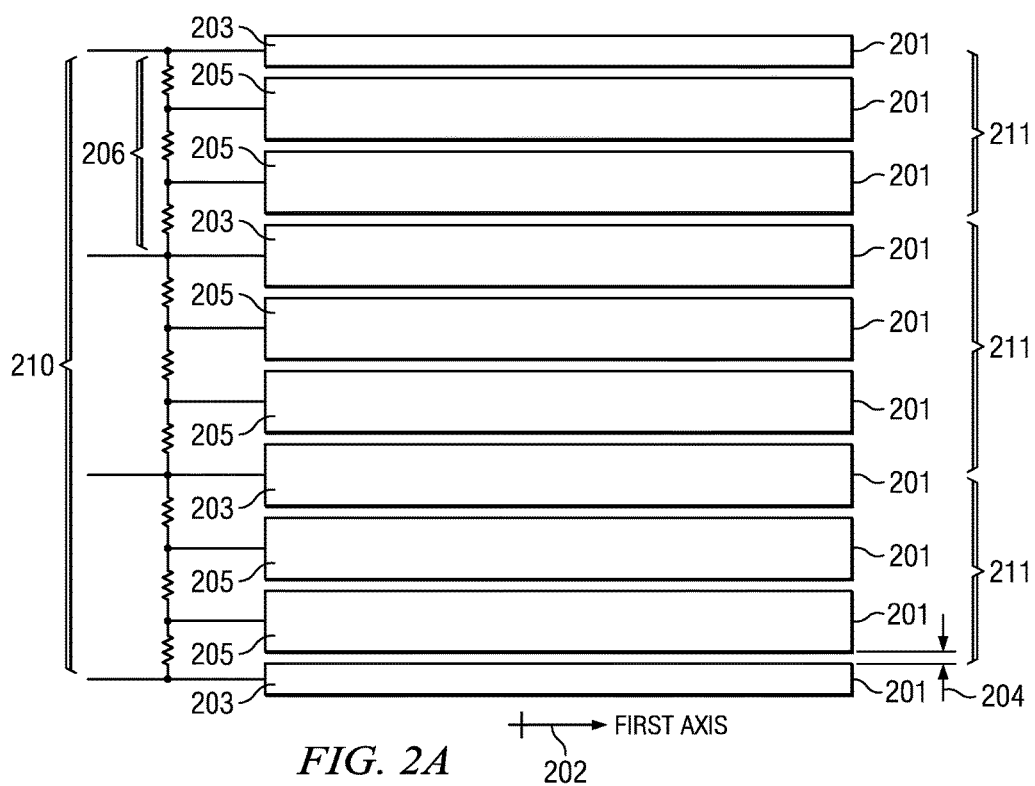
FIG. 2A shows an electrode pattern of drive electrodes with resistive elements according to an embodiment of the invention.

FIG. 2A shows an electrode pattern of drive electrodes with resistive elements according to an embodiment of the invention. Layer 1 is the layer farthest from the touch surface. On Layer 1 is an array of transmitting electrodes as shown in FIG. 2A. The electrodes 201 are arranged as a series of solid bars running along a first axis 202 or a first direction. A subset of the bars 203 is connected to the control chip so that they can be driven as the transmitter in the transmit-receive arrangement described above. The driven bars 203 include the outer most bars and then an even gap 204 between the remaining driven bars. The intermediate bars 205 are connected using resistive elements 206 in a chain 210, the ends of the chain being connected to two adjacent driven 203 bars. The driven bars 203 will be referred to as driven-X-bars and the resistively connected bars 205 will be referred to as resistive-X-bars.

Figure 2B:
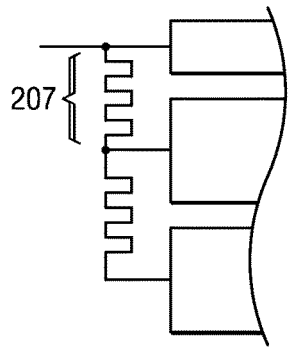
FIG. 2B shows a portion of the electrode pattern shown in FIG. 2A with a meander pattern of electrode material.
Figure 2C:
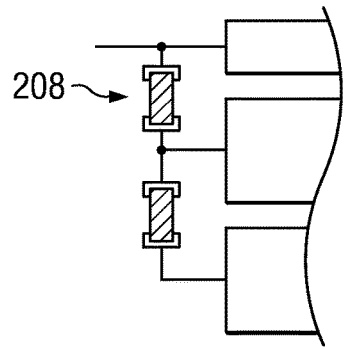
FIG. 2C shows a portion of the electrode pattern shown in FIG. 2A with screen printed resistors.
Figure 2D:
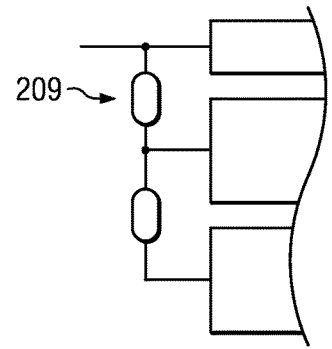
FIG. 2D shows a portion of the electrode pattern shown in FIG. 2A with discrete resistors.

FIGS. 2B, 2C and 2D show three different ways in which to form the resistive elements 206. Namely, the resistive elements 206 can be formed using the intrinsic resistance of the electrode material itself in a "meandered" pattern 207 at the edge of the touch screen (see FIG. 2B), or can be screen printed resistive material 208 at the edge (see FIG. 2C), or can be physical discrete resistors 209 either at the edge of the pattern (see FIG. 2D) or on a separate circuit. The latter option increases the interconnecting wiring substantially but can be advantageous in some designs.

The resistive chain 210 is used to act as a classic potential divider, such that the amplitude of the transmit signal is progressively attenuated between one driven-X-bar and the adjacent driven-X-bar. The set of driven and resistive bars so described will be referred to as a "segment" 211. Using this chain, if say driven-X-bar #1 303 is driven with a pulse train 305 relative to 0V 306 with a peak-to-peak voltage V 307, and driven-X-bar #2 304 is driven to 0V, then resistive-X-bars in between these two will be ratiometrically attenuated.

Figure 3:
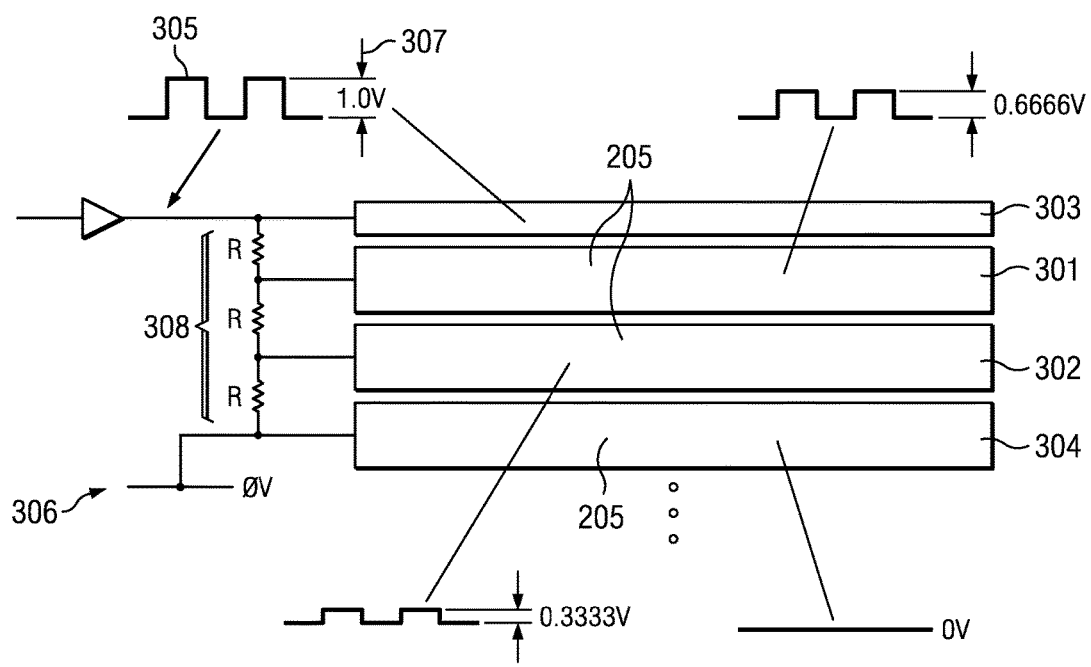
FIG. 3 shows a portion of the electrode pattern shown in FIG. 2B.

FIG. 3 shows a portion of the electrode pattern shown in FIG. 2B in which example, if there were 2 resistive-X-bars 205 and the resistor divider chain 210 is constructed of equal valued elements R 308, then the resistive-X-bar #1 301 will have a peak-to-peak voltage of 0.66666V and resistive-X-bar #2 302 will have a peak-to-peak voltage of 0.33333V. This has the effect of progressively weakening the electric field emitted from these resistive electrodes and so forms an interpolating effect for the capacitive changes within the segment between driven-X-bars. Hence, the linearity of the capacitive changes when moving within a segment is improved. Operating without resistive-X-bars is possible but the linearity is poor because the electric field decays over distance in a strongly non-linear fashion. By introducing evenly spaced resistive emitters emitting at an amplitude that is a linear division from the associated driven-X-bar, the field tends to "fill in" and form a better approximation to a linear system.

In the forgoing description Layer 1 is a pattern of transmit-electrodes, which may also be referred to as drive electrodes. The electrode pattern of Layer 1 may also be referred to as X-electrodes. The drive electrodes include the driven-X-bars 203 and the intermediate X bars 205 or resistive-X-bars. Furthermore, the driven or drive electrodes are defined as being made up of outer most driven-X-bars 203 and intermediate X bars or resistive-X-bars 205 connected using resistive elements 206 in a chain 210. The outer most X bars are referred to as driven-X-bars 203. However, it will be appreciated that all of the X-bars might be driven X-bars without using resistive elements.

Typical resistive elements 206 have resistive values ranging from a few KΩ up to high 10's of KΩ. Lower values require more current (and hence energy) to drive from the control chip but allow faster capacitive measurements as they have lower time constants and hence can be charged and discharged faster. Higher values require less current (and hence energy) to drive but have higher time constants and hence must be charged and discharged more slowly. Larger values also help to make any resistance build up in interconnecting wiring contribute a smaller voltage drop to the emitted field strength from the X bars, and hence make for a more efficient system. For this reason, generally higher values are preferred.

Another key reason to include the resistive-X-bars is that it makes the segment scalable, i.e. by adding more resistive-X-bars the segment can be made larger. This is at the expense of spatial resolution; the segment uses the same two driven-X-bars and hence the resolution of the measurement must be fundamentally the same, but the segment is now spread across a larger region and so spatially the resolution degrades. Making the segment scalable means that fewer driven-X-bars are needed and hence fewer connections to the control chip. By balancing the trade-off between spatial resolution and connection cost/complexity an optimal solution may be found for each design.

Overall, the bars in Layer 1 can be seen to be substantially area filling; almost all of the surface area is flooded with electrode. The gaps between the bars 205 can be made arbitrarily small and indeed, the smaller the better from a visibility point of view. Making the gaps larger than around 100 μm is non-ideal as this leads to increased visibility of the gap to the human eye and a key goal is often to try and make an invisible touch screen. A larger gap also tends to increase the possibility of a significant fringing electric field near the gap to electrodes in Layer 2 which will lead to worsening non-linearity. Gaps of a few 10's of micrometers are common as they are almost invisible and can be easily mass-produced, for example gaps of between 20 and 50 micrometers.

Figure 4:
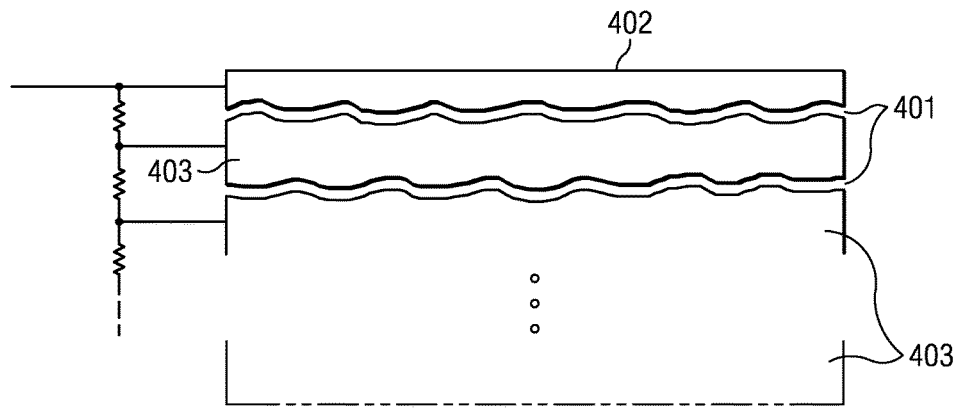
FIG. 4 shows a portion of the electrode pattern of drive electrodes according to an embodiment of the invention.

FIG. 4 shows a portion of the electrode pattern of drive electrodes according to an embodiment of the invention. Referring to FIG. 4, it is also desirable to use a gap with a small up/down wave pattern 401 between driven 402 and resistive-X-bars 403 as this helps to disguise the gap when viewed through Layer 2 with the added effect of the parallax caused by the substrate thickness. Various patterns can be used to help disguise the gap when viewed in this way, for example a sine wave, triangle wave or square wave could be used. The frequency and amplitude are chosen to help break up the otherwise long linear gap when viewed through the complex but regular pattern in Layer 2. The amplitude must be minimized to avoid errors in the reported touch coordinate.

Figure 5A:
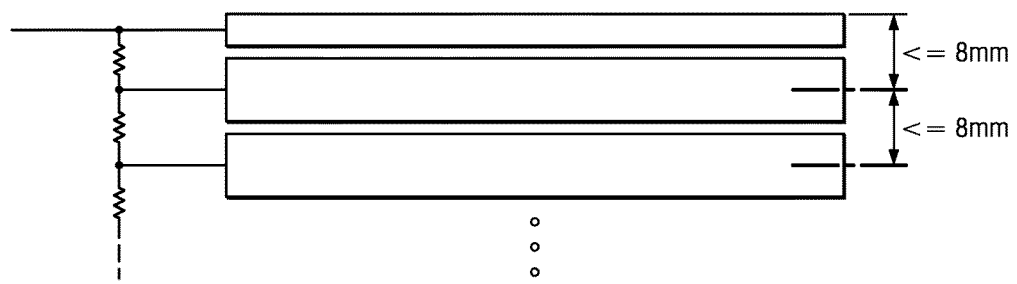
FIG. 5A shows a portion of the electrode pattern shown in FIG. 2A.

FIG. 5A shows a portion of the electrode pattern shown in FIG. 2A.

Figure 5B:
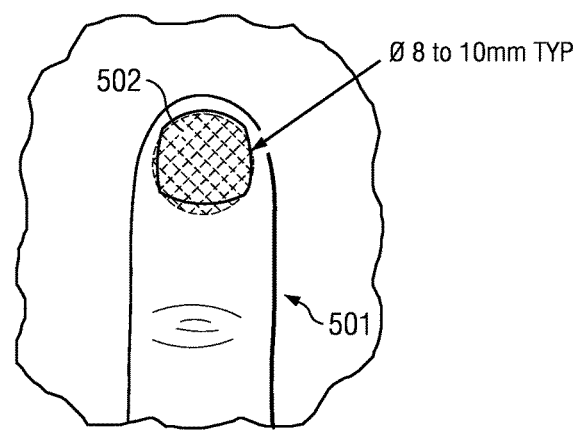
FIG. 5B shows a typical finger tip.

FIG. 5B shows a typical finger tip.

The electrode bars (both types) are generally designed so that they have a fundamental pitch of around 8 mm or less, as shown in FIG. 5A preferably 5 mm. This is in recognition that, as shown in FIG. 5B, a typical finger touch 501 creates a generally circular region 502 (illustrated in FIG. 5B with hashing) of around 8 to 10 mm in diameter and so matching the electrode pitch to the touch size optimizes the interpolating effect of the touch. Making the pitch of the electrodes larger than 8 mm can start to lead to distinct non-linearity in the response as the interpolation is well below ideal. In essence, by making the electrode bars too wide, as the touching finger moves perpendicular to the bars its influence tends to "saturate" over one electrode before it starts to interact with the next electrode to any significant degree. When the pitch is optimized, the finger will cause a steadily reducing influence on one bar while already starting to create a well balanced increase on the neighboring bar, with the peak influence being spatially quite distinct i.e. steady increase immediately followed by steady decrease with no appreciable transition distance from increase to decrease (or vice-versa).

Figure 6:
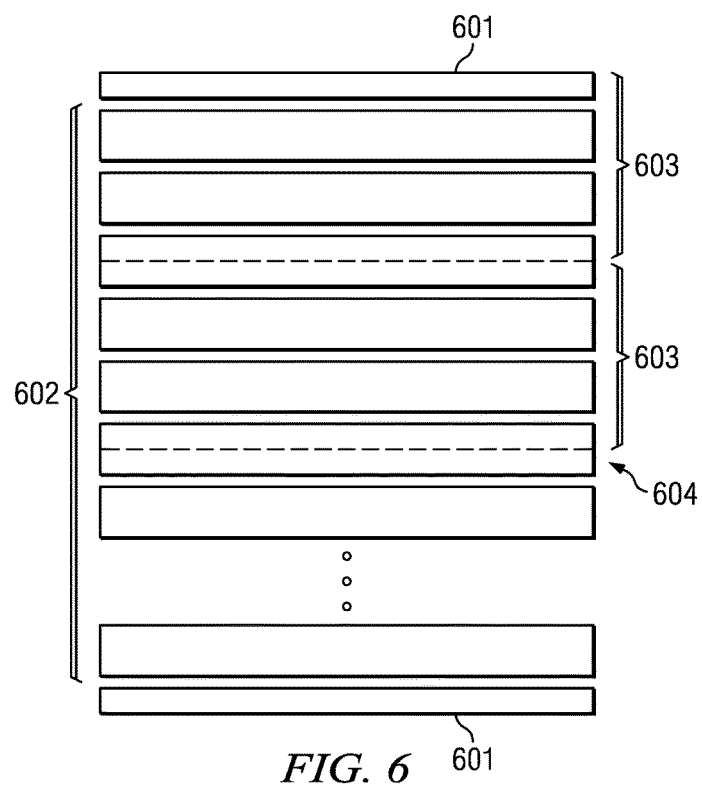
FIG. 6 shows an electrode pattern of drive electrodes according to an embodiment of the invention.

FIG. 6 shows an electrode pattern of drive electrodes according to an embodiment of the invention. Referring to FIG. 6 the driven-X-bars at the outer edges of Layer 1 601 are made to be half the width of all other bars 602. The overall design is in essence several identical concatenated segments 603, and the driven-X-bars on the inside of the layer 604 are also half width but are butted up to the neighboring segment with its half width outer bar, so driven-X-bars internal to the pattern appear to be full width. FIG. 6 shows the virtual division of the internal bars 604 with a dashed line; in practice of course the bars 604 are one-piece.

Having the pattern at its outer two edges with half-width bars improves the overall linearity; if the pattern were infinite then the linearity would be perfect in this regard, but of course the pattern must end and hence there is a natural non-linearity at the edges.

Figure 7A:
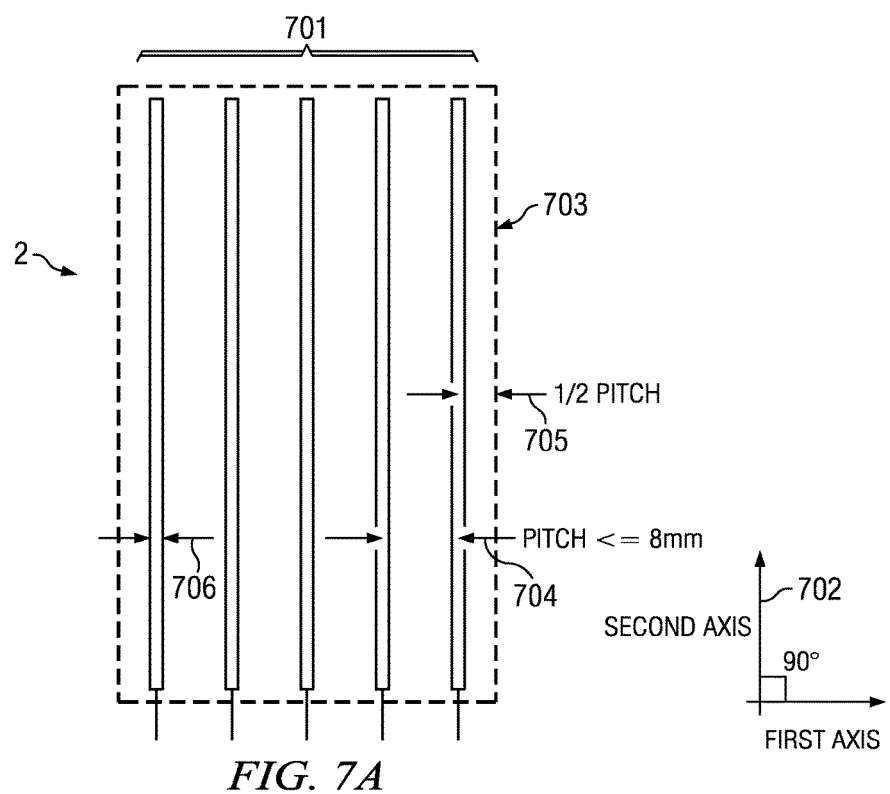
FIG. 7A shows an electrode pattern of sense electrodes according to an embodiment of the invention.

FIG. 7A shows an electrode pattern of sense electrodes according to an embodiment of the invention. Layer 2 is the layer nearest to the touch surface. Referring to FIG. 7A in its simplest form, the electrodes on Layer 2 are a uniformly spaced series of narrow lines running along a second axis at nominally 90 degrees to the first axis used in Layer 1 herein referred to as a second direction. That is to say that the Layer 1 or drive electrodes cross the Layer 2 or sense electrodes. The electrodes on Layer 2 are referred to as sense electrodes, Y-electrodes, Y lines or receive electrodes. They are arranged to lie directly and completely over the area 703 occupied by the X bars underneath. The spacing between the Y lines has a similar influence on the linearity as does the spacing of the X bars. This means that the Y lines need to be spaced with a pitch of 8 mm or less 704, preferably 5 mm for best intrinsic linearity. In a similar way to the Layer 1 with its half-width outer X bars, the gap from the edge of the Layer 2 pattern to the first line is half of this pitch 705 to improve the linearity. The width of the Y lines 706 is important. They need to be narrow enough so that they are not easily visible to the human eye, but wide enough that they have a resistance (at their "far-end") that is low enough to be compatible with capacitive measurements. Narrower is also better as far as noise immunity is concerned because the surface area of the Y line has a direct influence on how much electrical noise can be coupled into the Y lines by a finger touch. Having narrower Y lines also means that the capacitive coupling between the X and Y layer is minimized, which, as previously mentioned, helps to maximize signal-to-noise ratio.

Figure 7B:
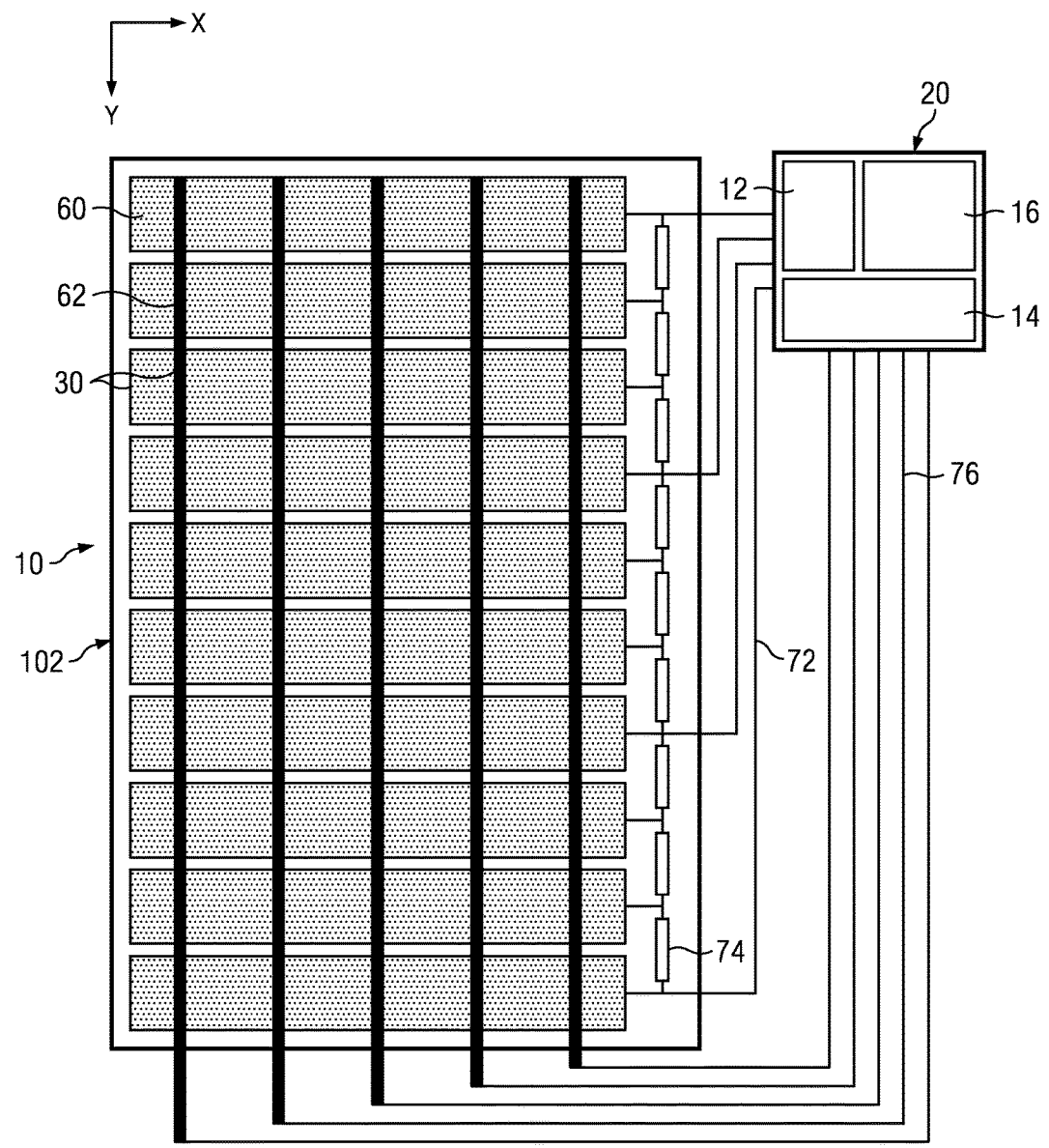
FIG. 7B shows a two-electrode layer capacitive touch screen according to an embodiment of the present invention with drive and sense units connected via channels to a controller.

FIG. 7B shows a touch sensor 10 according to an embodiment of the invention. The sensor 10 shown in the figure combines the electrode patterns from FIG. 2A and FIG. 7A. The sensor 10 comprises a substrate 102 bearing an electrode pattern 30 defining a sensitive area or sensing region of the sensor and a controller 20. The controller 20 is coupled to electrodes within the electrode pattern by a series of electrical connections which will be described below. The electrode pattern 30 is made up of Layer 1 electrodes and Layer 2 electrodes on opposing sides of the substrate 102 as shown in FIG. 1B.

Referring to FIG. 7B, the controller 20 provides the functionality of a drive unit 12 for supplying drive signals to portions of the electrode pattern 30, a sense unit 14 for sensing signals from other portions of the electrode pattern 30, and a processing unit 16 for calculating a position based on the different sense signals seen for drive signals applied to different portions of the electrode pattern. The controller 20 thus controls the operation of the drive and sense units, and the processing of responses from the sense unit 14 in the processing unit 16, in order to determine the position of an object, e.g. a finger or stylus, adjacent the sensor 10. The drive unit 12, sense unit 14 and processing unit 16 are shown schematically in FIG. 7B as separate elements within the controller. However, in general the functionality of all these elements will be provided by a single integrated circuit chip, for example a suitably programmed general purpose microprocessor, or field programmable gate array, or an application specific integrated circuit, especially in a microcontroller format.

In the figure there is provided a number of drive electrodes 60 represented by longitudinal bars extending in the x-direction as described above and shown in FIG. 2A. On the opposing surface of the substrate 102, there is provided a number of sense electrodes 62 forming electrode Layer 2 as shown in FIG. 7A and described above that cross the drive electrodes 60 of Layer 1 in the y-direction.

The sense electrodes are then connected to the sense unit 14 via connections or tracks 76 and the drive electrodes are connected to the drive unit 12 via connections or tracks 72. The connections to the drive and sense electrodes are shown schematically in FIG. 7B. However, it will be appreciated that other techniques for routing the connections or tracks might be used. All of the tracks might be routed to a single connector block at the periphery of the substrate 102 for connection to the controller 20.

The operation of the sensor 10 shown in FIG. 7B is described below. As can be seen there are conflicting requirements for the Y lines in terms of their width. The strongest requirement tends to be the minimization of the resistance of the Y line to ensure successful capacitive measurement within an acceptable overall measurement time. This leads to wider electrodes, typically in the region of 100 μm to 1000 μm. Where the visibility of the electrodes is either not an issue or where the electrodes can be made practically invisible (such as index matched ITO on PET for example), then the compromises are all quite easily accommodated and the width increase is a simple choice. But where the visibility is an issue and the method used to fabricate the electrodes cannot be made sufficiently invisible (such as non index matched ITO on glass) then some alternative arrangement must be found. In this case, a method called in-filling can be used as now described and illustrated.

Figure 8A:
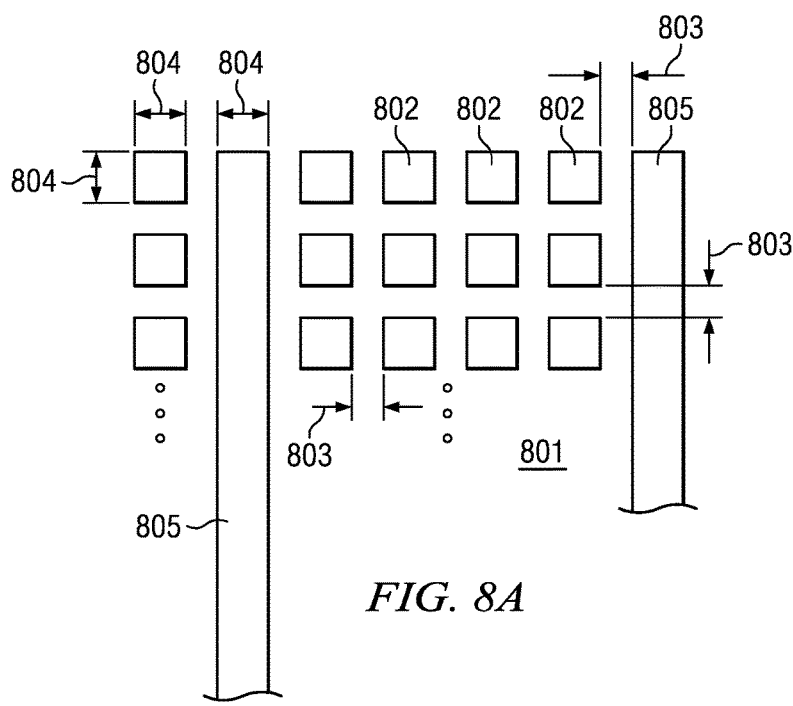
FIG. 8A shows schematically in plan view a portion of the electrode pattern shown in FIG. 7A with infilling electrodes.

FIG. 8A shows a portion of the electrode pattern shown in FIG. 7A with infilling electrodes. This method fills all "unused" 801 space with isolated squares of conductor 802 (ITO for example), separated with gaps 803 to its neighbors that are small enough to be practically invisible and small enough to cause significant square-to-square capacitance. Another key factor in designing the isolated elements or islands is to make them the same size 804 in each axis as the width of the Y lines 805. In this way, the uniformity of the overall pattern is optimal, and the only irregularity is in the length of the Y lines. This pattern is substantially invisible to the human eye. The gaps between neighboring squares, and the gaps between squares and neighboring Y lines can be made arbitrarily small, typically in the region of 10's of μm as they are almost invisible and can be easily mass-produced. The in-filling is generated during manufacture at the same time, and using the same process steps, as the sense electrodes, so they are made of the same material and have the same thickness and electrical properties as the sense electrodes. This is convenient, but not essential. The in-filling could be carried out separately in principle.

The isolated squares 802 serve to obscure the overall pattern but they also act as a capacitive interpolator (somewhat analogous to the resistive interpolator used in Layer 1). The capacitive interpolator so formed has the effect of only minimally impacting the fringing fields between the Y line and the underlying X bars. This is important because the field must spread out down to the X bars sufficiently from the edges of the Y lines to allow a substantial touch influence over at least half the pitch of the Y lines. This holds true so long as the capacitance from square to square is substantially higher (at least ×2) the capacitance of a square down to the X bars. The reason for this is that under these conditions the electric field tends to propagate from square to square more easily than it is shunted down to the X layer. As a result, the field distributions of a design with no in-fill compared to one with in-fill are similar enough that the linearity is preserved. If the square-to-square gaps are increased, the linearity degrades because the field tends to pass via the first couple of squares away from a Y line down to the X bars and so does not propagate far from the Y line.

Figure 8B:
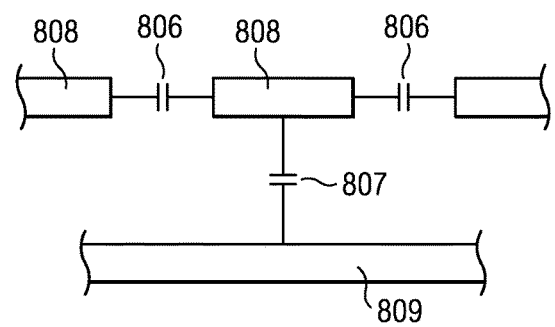
FIG. 8B is a cross-section through a part of FIG. 8A illustrating capacitive paths between infilling electrodes and an X electrode.

FIG. 8B illustrates these capacitive paths between example infilling electrodes and between an example infilling electrode and an example X electrode. Capacitance from square 808 to square 808 is shown with nominal capacitors 806 and capacitance from one of the squares 808 down to an adjacent X bar 809 is shown with nominal capacitor 807.

It should be noted that the in-fill is not actually needed in this design, but it can be used to minimize pattern visibility without compromising the linearity of the output.

In operation the transmitting or drive electrodes are sequenced such that only one driven-X-bar 203 is ever active at one time, all others being driven to a zero potential. The field emitted therefore only radiates from one segment at a time. This radiated field couples locally into all of the Y lines 701 above the segment in question. The control chip then takes a capacitive measurement for each of the "intersections" or "crossings" formed between the X and the Y electrodes in this segment. Each XY intersection is also known as a node. In sequence, each driven-X-bar is activated, holding all others at zero potential. In this way, each segment is sequentially scanned. Once all segments have been completed, a total of N×M nodes will have been measured where N is the number of driven-X-bars and M is the number of Y lines. It should be stressed that the node measurements are all independent of each other making it possible to detect several touch locations simultaneously. Another important point in the way the XY array is scanned is that because only one segment is active at any one time, the others being driven to zero potential, only touches in the active segment can influence the measured node capacitances in that segment (at least to a first approximation). This means that an effect known as "hand-shadow" is strongly minimized. Hand-shadow is an effect caused by the proximate location of the palm, thumb, wrist etc to the touch screen when the user touches with a finger.

Figure 9:
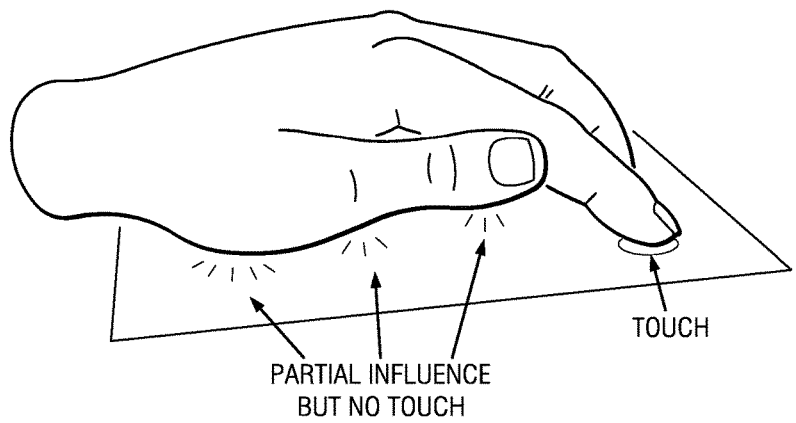
FIG. 9 shows hand-shadow caused by a proximate location of the palm, thumb, wrist etc to a touch screen when the user touches with a finger.

FIG. 9 shows hand-shadow caused by a proximate location of the palm, thumb, wrist etc to a touch screen when the user touches with a finger. The nature of capacitive measurement means that the electric fields tend to radiate or project from the surface of the device and so can be influenced even by objects that are not in direct contact with the surface. This influence would normally serve to distort the reported touch location, as the combined capacitive readings of the finger together with readings caused by the "hand shadow" would slightly corrupt the computed coordinates reported by the control chip. By activating only one segment at a time this normally problematic effect is drastically reduced.

Having scanned the entire touch screen, generating N×M node measurements, it is a simple task to compute the touch location, in both of the axes, of one or more objects, as described in U.S. patent application 60/949,376 published as WO 2009/007704 on 15 Jan. 2009, using a combination of logical processing to discover the node at the approximate centre of each touch, and standard mathematical centroid computations of the relative signal strengths around each touch detected. The touch location along the first axis is resolved using the touch's centre node signal and the immediately adjacent node signal to each side that lie along the first axis. Likewise, the location in the second axis is resolved using the centre node and the immediately adjacent node signals that lie along the second axis.

A key design advantage in having the entire Layer 1 almost entirely covered or flooded with emitting X electrodes is that because these electrodes are virtually immune to changes in parasitic capacitive loading (they are relatively low impendence drivers, even the resistively coupled X bars still only have DC resistances of a few 10's of KΩ and so can charge and discharge any moderate parasitics very quickly) any change in the distance between the rear (non-touch side) of Layer 1 and a nearby ground load will make no difference to the measured capacitances of the nodes. The touch screen is thus touch-sensitive only on one side, Layer 2. This has major benefits when slightly flexible front panels are used that can bend relative to an LCD placed below the touch screen. The separation between Layer 1 and Layer 2 is fixed by the substrate material and hence the capacitance between these two is fixed even if the substrate is bent during touch causing the rear of Layer 1 to experience a change in its ambient conditions.

A further advantage to using the flooded X design is that it provides an inherent amount of noise attenuation for radiated emissions that are present behind Layer 1. This is common with LCD modules that tend to have large amplitude drive signals present on their outer layers. These drive waveforms will normally couple to the Y lines and disturb the momentary reported capacitance of the associated nodes. However, because the Y lines are effectively shielded by the flooded X layer, the only remaining mechanism for the noise to couple to the Y lines is capacitively via the X layer itself. The X bars, as already described, are reasonably low resistance and so can only be disturbed by the interfering noise waveform in proportion to the ratio of the impedance of the noise coupling vs. the impedance of the X bar. Hence, the amount of noise coupled onward to the Y lines is attenuated by this ratio. The coupling of the noise waveform to X bars is purely capacitive and so decreasing this coupling capacitance helps to attenuate the interference even more. This can be achieved by arranging an air gap between the LCD and the back of Layer 1, or by using a transparent dielectric spacer layer instead of the air gap that will yield a higher capacitance of coupling but has the advantage of being mechanically robust. In a traditional capacitive touch screen an entire extra "shielding" layer below Layer 1 must often be used to mitigate this LCD noise. This layer is often driven to zero potential or is actively driven with a facsimile or copy of the capacitive acquisition waveform, which serves to isolate the noise from the capacitive nodes. This has the disadvantage of adding cost and complexity, worsens optical properties and also tends to attenuate the size of the change in capacitance during touch (leading to lower resolution and worse signal-to-noise ratio). The flooded X design described herein will often produce sufficient inherent attenuation of the coupled noise that no extra layer is required, offering a substantial commercial advantage.

Another advantage found with this design is that the Y lines can be made narrow in comparison to the size of the touching object. In particular, the Y lines can have a width of one quarter or less than the size of the touching object, or equivalently the pitch of the X electrodes. For example, a Y line width of 0.5 mm is 16 times narrower than the width of a typical finger touch. The implication of this is related to the surface area available for interaction with the touching finger. A narrow Y line has a very small surface area to couple capacitively to the touch object; in the example cited, the coupled area is around 4 $mm^2$ compared with the total "circular" touch area of around 50 $mm^2$. With such a small area coupled to the touch, the amount of noise injected into the Y line from the finger is minimized because the coupling capacitance is small. This has an attenuating effect on any differential noise between the touch object and device using the touch screen. Furthermore, by making narrow Y lines the resistance is reduced. Reducing the resistance of the Y lines reduces the acquisition times and decreases the power dissipation.

In summary, the advantages of the described touch screen are:
1. Only two layers are required for construction leading to; (i) improved optical transmission (ii) thinner overall construction (iii) lower cost.
2. Area filling design for electrodes on Layer 1 leading to; (i) almost invisible electrode pattern when using ITO (ii) isolation of the Y lines on Layer 2 from capacitive effects below Layer 1 (iii) partial attenuation of noise coupled from an underlying LCD module or other noise source.
3. Narrow Y lines on Layer 2 with optional area filling isolated squares leading to; (i) almost invisible electrode pattern when using ITO (ii) reduced electrode area reduces susceptibility to coupling noise from touch.

In some designs it may be desirable to minimize the number of Y lines used across Axis 1—labeled the first axis in FIG. 7A. This generally leads to a lower cost control chip and simplifies interconnection of the electrodes. With the described Y line design, the fundamental pitch between lines needs to be 8 mm or below to achieve good linearity. Spacing the lines further apart rapidly compromises linearity in Axis 1. To enable the Y lines to have a greater "reach" there are several adaptations that can be made to the Layer 2 design.

Figure 10:
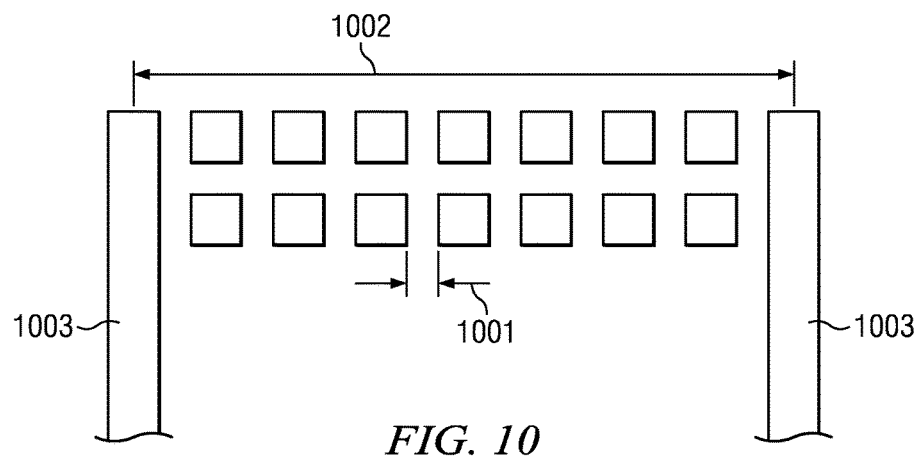
FIG. 10 shows a portion of the electrode pattern shown in FIG. 7A with infilling electrodes.

FIG. 10 shows a portion of the electrode pattern shown in FIG. 7A with infilling electrodes according to a first option. The first option shown in FIG. 10 is to use the capacitive interpolator technique previously described with the square-to-square gap 1001 reduced to allow the electric field to propagate further away from the Y line and so allow a larger pitch 1002 between Y lines 1003. This technique may require that the ratio of capacitance between squares vs. square to X bars must be carefully tuned to achieve the best linearity.

Figure 11:
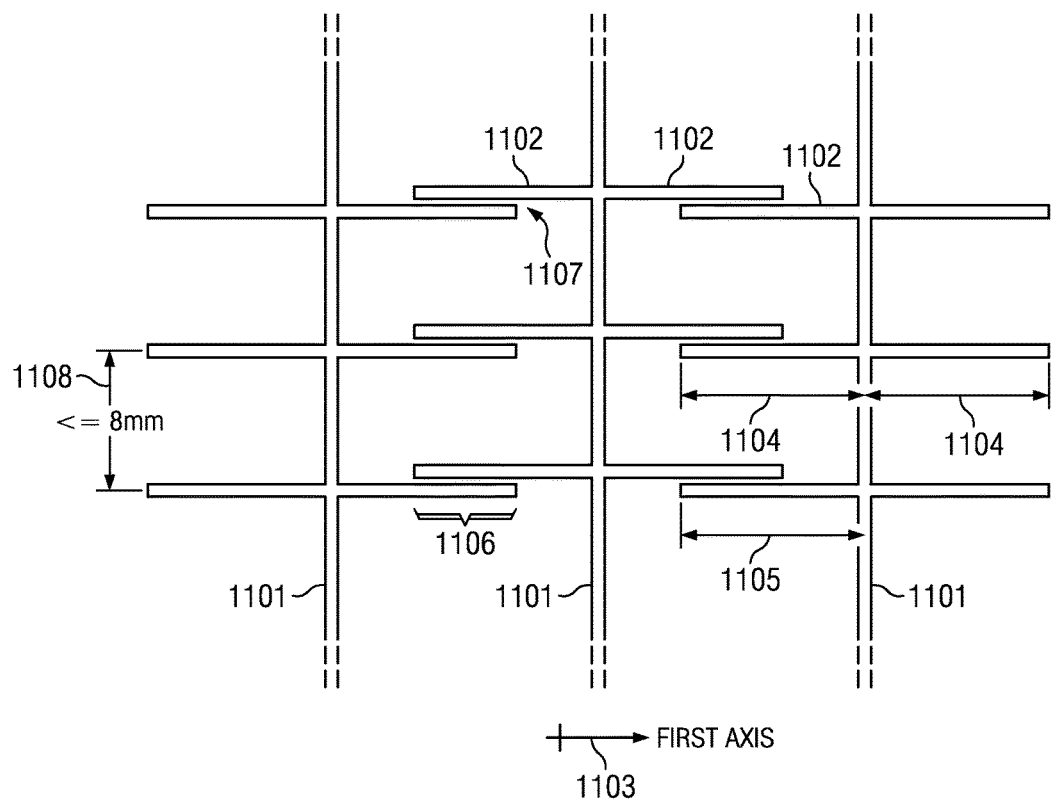
FIG. 11 shows a portion of an electrode arrangement of sense electrodes.

FIG. 11 shows a portion of an electrode arrangement of sense electrodes according to a second option and more flexible option which modifies the Y line 1101 design to add a series of cross-members 1102 running along the first axis 1103 and equally disposed 1104 so as to be centered about the Y line. The cross members span approximately ½ to ¾ of the gap to the next Y line 1105 in both directions. The cross members on each successive Y line are arranged so that they overlap the cross members of those on the neighboring Y lines 1106 with the gap 1107 between the overlapping sections chosen to be a few 10's of µm to minimize visibility and prevent any substantial fringing fields from forming along the inside of the overlapped region. The cross members are spaced by a distance 1108 along the Y line on a pitch of 8 mm or less, and ideally they are spaced to lie with a uniform relationship to the gaps in the underlying X bars. This ensures that the field patterns are uniform and symmetrical in all regions of the touch screen, leading to good linearity. The cross members effectively act to spread the electric field further beyond the primary Y line and the overlapped region helps to gradate the field from one Y region to the next in a linear fashion.

Embodiments of the invention shown in FIGS. 2A, 7A, 7B and 11 may further comprise connections to both extents of the drive and sense electrodes or transmitting electrodes and Y lines respectively. That is to say that a connection is made at both ends of each of the drive and sense electrodes. This may increase the linearity of the electric filed along the drive electrodes and improve the shielding of the flooded electrode design.

Embodiments of the invention may also be applied to non-display applications, for example touch pads on a laptop or control panels on domestic appliances.

Figure 12:
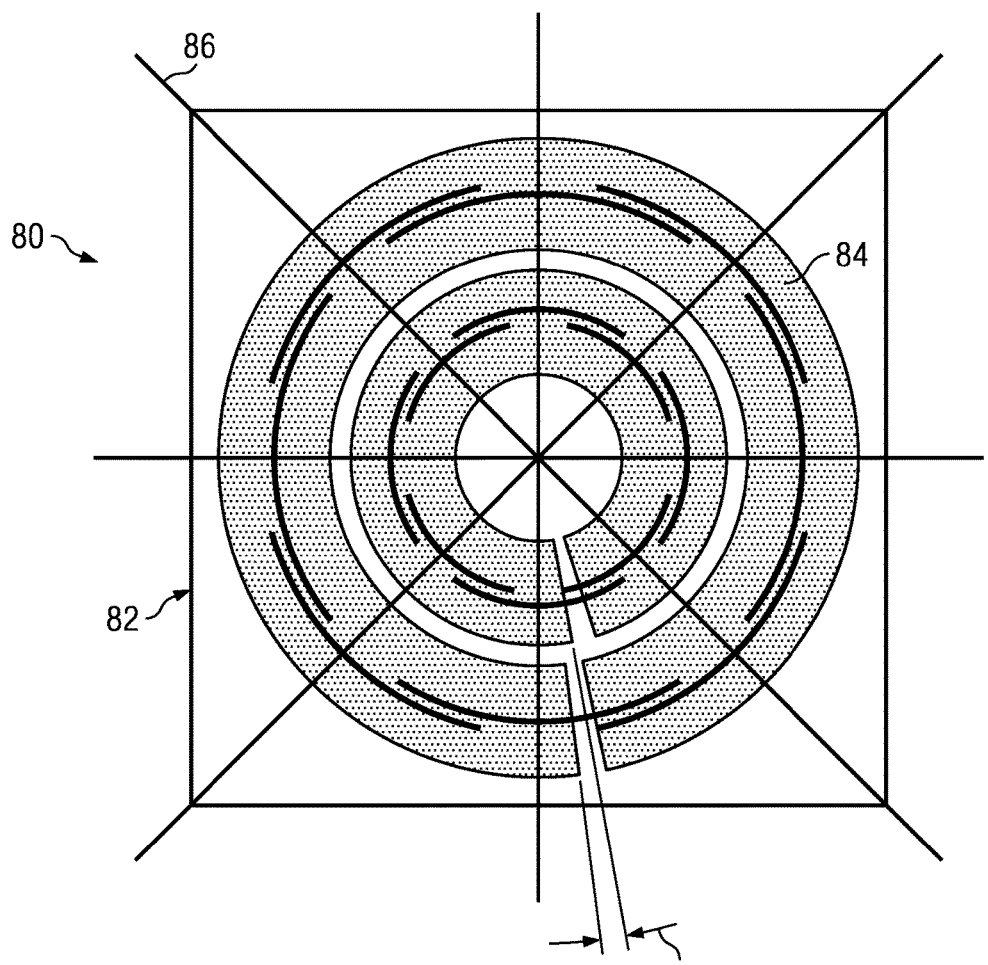
FIG. 12 shows a two-electrode layer capacitive touch screen according to another embodiment of the present invention.

FIG. 12 shows a sensor 80 comprising an electrode pattern according to an embodiment of the invention. For simplicity the electrode pattern shown in the figure does not include any circuitry. However, it will be appreciated that drive and sense circuitry may also be used as described above for the FIG. 7B embodiment. The figure shows an electrode pattern on opposing sides of a substrate 82, viewed from above to show the relative position of the electrode patterns.

The electrode pattern comprises two annular electrodes of the type described above referred to as Layer 1 or transmit electrodes. The transmit electrodes may also be referred to as drive electrodes. The drive electrodes 84 shown in the figure are effectively the transmit electrodes shown in FIG. 2A and have been wrapped around arcuately to form a complete, or near complete, ring or annulus, as might be used by a scroll wheel sensor for example. Connected to each of the drive electrodes 84 is a connection or track 90 to provide a drive signal from an appropriate drive unit (not shown). The drive unit described above may be used. The electrode pattern further comprises a number of sense electrodes referred to above as Layer 2 electrodes 86 which extend radially from a central point. The Layer 2 electrodes may also be referred to as sense electrodes or receive electrodes. The sense electrodes 86 are in the form shown in FIG. 11 and described above. The sense electrodes are connected to a sense unit (not shown) via connections or tracks (not shown). The operation of the sensor 80 is similar to that described above. However, the readout from a processing unit (not shown) connected to the drive and sense units will be different. The output of the processing unit will provide a polar co-ordinate of an object adjacent the sensor 80. The sensor 80 shown in FIG. 12 may be used in an application where two circular controls are typically used in combination, for example the bass and treble controls or the left/right and front/rear fade controls on a hi-fi amplifier. It will be appreciated that further annular shaped drive electrodes may be implemented in the sensor 80 shown in the figure. This embodiment may therefore be summarized as following a polar coordinate grid, with the two electrode types extending radially and arcuately, in contrast to the other embodiments which follow a Cartesian coordinate grid, with the two electrode types extending along the x- and y-axes.

In a modification of the FIG. 12 design, the arcuate path may extend over a smaller angle for example a quarter or half circle instead of a full circle, or another angular range.

Figure 13:
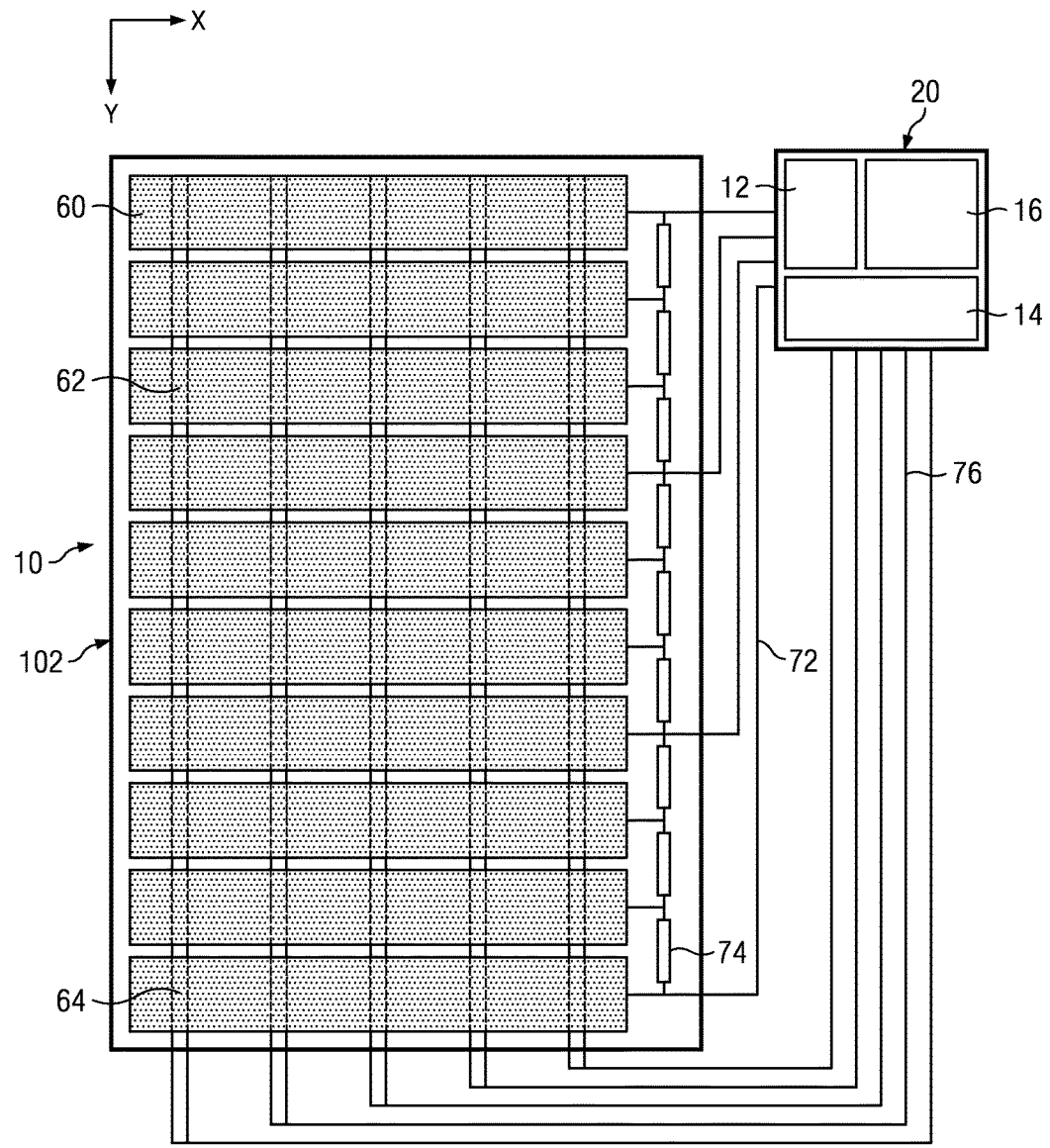
FIG. 13 shows a two-electrode layer capacitive touch screen according to an embodiment of the present invention with drive and sense units connected via channels to a controller.

FIG. 13 is a view of a front side of a position sensor 10 according to an embodiment of the invention. The same reference numerals used in FIG. 7B are used in reference to the sensor 10 shown in FIG. 13 where appropriate. The position sensor shown in FIG. 13 is similar to the sensor shown in FIG. 7B in layout and operation. However, the position sensor shown in the figure has an alternative arrangement of electrodes. The drive and sense electrodes shown in the figure are made up of thin wires or a mesh of wire instead of the continuous layer of electrode material shown in FIG. 7B. The drive electrodes 60 are made up of a rectangular perimeter to define the shape of the drive electrode with a series of diagonal lines going across the rectangular perimeter. The diagonal lines are typically arranged at an angle, preferably approximately 45±15 degrees, to an axis in extending in the x-direction. The diagonal lines and the rectangular perimeter of each drive electrode are electrically connected and connected to the drive unit 12 via the drive channels 72. The wires or mesh are manufactured from high electrical conductivity material such as metal wires, where the metal is preferably copper, but could also be gold, silver or another high electrical conductivity metal. The sense electrodes are manufactured in a similar way using thin metal traces that follows the perimeter of the sense electrode pattern shown in FIG. 7B. The sense electrodes 62 are relatively narrow compared to the drive electrodes 60, so there is no need to use in-filling with diagonal lines. However, some extra wires are added within the sense electrode mesh structure as shown in FIG. 13 by lines 64 which bridge between peripheral wires in each electrode. These bridge wires add redundancy in the pattern in the sense that if there is a defect in a peripheral wire at one location, the current has an alternative path along the electrode. By defect we mean a break, local narrowing or other feature that causes a severe reduction in the local conductivity along a wire. Such defects can occur, for example, as a result of errors in the electrode patterning process. For example, if there is a defect in the optical mask used to pattern the wires or if there is debris on the surface of the wires during processing then defects can arise.

It will be understood that the "mesh" or "filligrane" approach to forming each electrode out of a plurality of interconnected fine lines of highly conducting wire or traces may be used for either Layer 1 (flooded X drive), Layer 2 (sense) or both. The FIG. 13 embodiment uses meshes for both layers. However, a particularly preferred combination for display applications or other applications where invisibility is important is that Layer 1 is made with non-mesh, i.e. "solid" electrodes with the small, invisible gaps, for example from ITO, and Layer 2 is made with mesh electrodes, for example out of copper, having line widths sufficiently small to be invisible also.

It will also be understood that the mesh approach of the embodiment of FIG. 13 can be used in a design of the kind illustrated in FIG. 11 and FIG. 12 in which the sense electrodes have overlapping branches.

What is claimed is:

1. A sensor comprising: a substrate; and a sensing region configured to sense a position of an object within the sensing region, the sensing region comprising: a plurality of drive electrodes disposed on a first side of the substrate in a first layer: and a plurality of sense electrodes disposed on a second side of the substrate in a second layer so that the sense electrodes intersect the drive electrodes at a plurality of intersections offset by a thickness of the substrate, wherein the plurality of drive electrodes are substantially area filling within the sensing region relative to the plurality of sense electrodes; wherein a gap between adjacent sense electrodes has a width that is at least three-fifths of the pitch of the sense electrodes; wherein the sensing region further comprises a plurality of isolated conductive elements disposed on the second side of the substrate between the sense electrodes so that, together, the plurality of sense electrodes and the plurality of isolated conductive elements are substantially area filling within the sensing region relative to the plurality of sense electrodes.

2. A computer-readable non-transitory storage media embodying logic that is configured when executed to: sense a position of an object within a sensing region, the sensing region comprising: a plurality of drive electrodes disposed on a first side of a substrate in a first layer; and a plurality of sense electrodes disposed on a second side of the substrate in a second layer so that the sense electrodes intersect the drive electrodes at a plurality of intersections offset by athickness of the substrate, wherein the plurality of drive electrodes are substantially area filling within the sensing region relative to the plurality of sense electrodes; wherein a gap between adjacent sense electrodes has a width that is at least three-fifths of the pitch of the sense electrodes: and communicate a capacitance sensed by the drive and sense electrodes and indicative of the position of the object within the sensing region; wherein the sensing region further comprises a plurality of isolated conductive elements disposed on the second side of the substrate between the sense electrodes so that, together, the plurality of sense electrodes and the plurality of isolated conductive elements are substantially area filling within the sensing region relative to the plurality of sense electrodes.

3. A method comprising: sensing a position of an object within a sensing region, the sensing region comprising: a plurality of drive electrodes disposed on a first side of a substrate in a first layer; and a plurality of sense electrodes disposed on a second side of the substrate in a second layer so that the sense electrodes intersect the drive electrodes at a plurality of intersections offset by a thickness of the substrate, wherein the plurality of drive electrodes are substantially area filling within the sensing region relative to the plurality of sense electrodes; wherein a gap between adjacent sense electrodes has a width that is at least three-fifths of the pitch of the sense electrodes: and communicating a plurality of signals resulting from a capacitance sensed by the drive and sense electrodes and indicative of the position of the object within the sensing region; wherein the sensing region further comprises a plurality of isolated conductive elements disposed on the second side of the substrate between the sense electrodes so that, together, the plurality of sense electrodes and the plurality of isolated conductive elements are substantially area filling within the sensing region relative to the plurality of sense electrodes.

* * * * *